United States Patent
Olsson et al.

(10) Patent No.: US 7,252,492 B2
(45) Date of Patent: Aug. 7, 2007

(54) DEVICES AND METHODS FOR ALIGNING A STAMP AND A SUBSTRATE

(75) Inventors: Lennart Olsson, Malmo (SE); Peter Andersson, Stockholm (SE)

(73) Assignee: Obducat AB (SE)

( * ) Notice: Subject to any disclaimer, the term of this patent is extended or adjusted under 35 U.S.C. 154(b) by 193 days.

(21) Appl. No.: 10/464,478

(22) Filed: Jun. 19, 2003

(65) Prior Publication Data

US 2004/0149367 A1   Aug. 5, 2004

Related U.S. Application Data

(60) Provisional application No. 60/389,891, filed on Jun. 20, 2002.

(30) Foreign Application Priority Data

Jun. 20, 2002   (SE) .................................... 0201913

(51) Int. Cl.
*B29C 59/02*   (2006.01)
(52) U.S. Cl. ...................... 425/143; 425/150; 425/170; 425/172; 425/412; 33/1 M; 33/613
(58) Field of Classification Search ................ 425/143, 425/150, 169–172, 408, 412; 33/1 M, 613, 33/545
See application file for complete search history.

(56) References Cited

U.S. PATENT DOCUMENTS

| | | | |
|---|---|---|---|
| 5,669,303 A | 9/1997 | Maracas et al. | |
| 5,947,027 A | 9/1999 | Burgin et al. | 101/474 |
| 5,993,189 A | 11/1999 | Mueller et al. | 425/405.1 |
| 6,442,858 B1 * | 9/2002 | Asano | 33/645 |
| 6,759,182 B2 * | 7/2004 | Ikeda et al. | 264/1.6 |

FOREIGN PATENT DOCUMENTS

| | | |
|---|---|---|
| EP | 0 794 016 A1 | 9/1997 |
| JP | 55-123131 * | 9/1980 |
| JP | 03-152540 * | 6/1991 |
| WO | WO 01/42858 A1 | 6/2001 |
| WO | WO 01/69317 A1 | 9/2001 |

* cited by examiner

*Primary Examiner*—Yogendra N. Gupta
*Assistant Examiner*—Thu Khanh T. Nguyen
(74) *Attorney, Agent, or Firm*—Finnegan, Henderson, Farabow, Garrett & Dunner, LLP

(57) ABSTRACT

There is provided a device for transferring a pattern from a stamp to a substrate, provided with a moldable film, by pressing the stamp and the substrate against each other. The device comprises at least one fixture for retaining a planar object such as the stamp or the substrate. The device is distinguished in that it comprises a heating element for heating the planar object, and measuring arrangement for determining a change in the size of the planar object due to the heating.

24 Claims, 9 Drawing Sheets

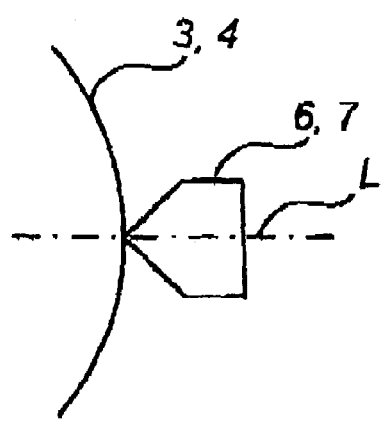
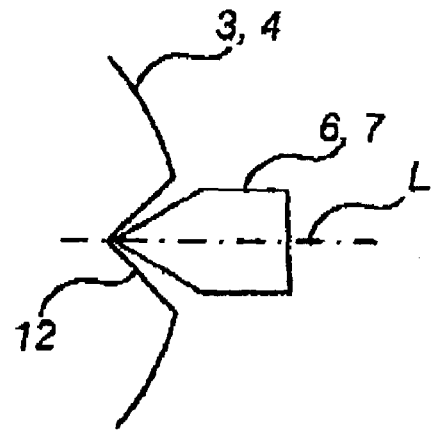
Fig. 7a
Fig. 7b
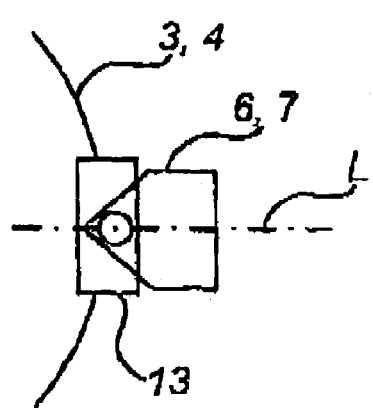
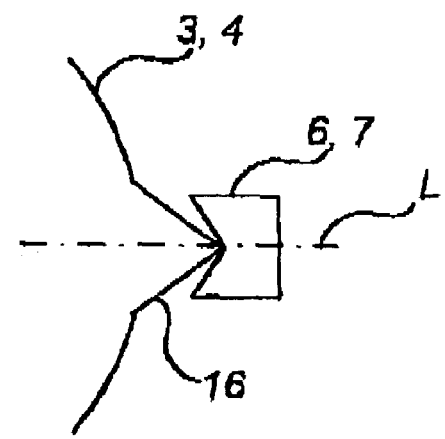
Fig. 7c
Fig. 7d

DEVICES AND METHODS FOR ALIGNING A STAMP AND A SUBSTRATE

CROSS-REFERENCE TO RELATED APPLICATIONS

This application is related to and claims the benefit of priority of Swedish Application No. 0201913-1, filed Jun. 20, 2002, the disclosure of which is expressly incorporated herein by reference in its entirety and claims the benefit of priority under 35 U.S.C. §119(e) to U.S. Provisional Patent Application No. 60/389,891, entitled "Devices and Methods for Aligning a Stamp and a Substrate," filed Jun. 20, 2002, the disclosure of which is expressly incorporated herein by reference in its entirety.

FIELD OF THE INVENTION

The present invention relates to a device and a method for imprint lithography and for cold and hot embossing. More specifically, the invention relates to a device and a method for aligning a stamp and a substrate when performing imprint lithography for providing structures on e.g. a nano scale.

BACKGROUND OF THE INVENTION

In connection with manufacturing of small structures, such as semiconductors, e.g. integrated circuits or memory media (CD, CD-ROM, DVD, hard disks etc.), imprint lithography may sometimes be used, particularly nanoimprint lithography, which is described in more detail in e.g. WO01/42858A1 and WO01/69317, which are hereby incorporated by reference.

Imprint lithography essentially comprises transferring a relief pattern from a patterned surface, which is referred to as a "stamp", onto a moldable surface, which is referred to as a "substrate". The substrate is normally provided with a moldable film. The substrate often consists of a metal- or silicon based material which is provided with e.g. a polymer film.

During the imprint process, the stamp is pressed against the substrate at a pressure which is high enough to cause the pattern on the stamp to form an imprint in the moldable film.

Subsequently, the substrate may be subjected to exposure to e.g. radiation (such as UV-radiation) or etching, whereby parts of the pattern in the moldable film are wholly or partially removed or hardened. This imprint process may be preceded by or followed by application of further layers of moldable film, further imprint steps or any treatment by means of other known semiconductor manufacturing techniques.

In connection with imprint lithography, it may be desirable to heat the moldable film in order to make it softer and thus to facilitate the transfer of the pattern.

Since the structures manufactured using this technique may be very small, in the order of a few nanometers (i.e. millionths of a millimeter), a very small change in the size of a substrate or a template may cause problems in positioning the pattern that is to be transferred. Typical substrates used for imprint lithography may exhibit temperature coefficients in the order of 0.01% per degree F. Thus, heating a substrate having a diameter of e.g. 20 cm from e.g. 25 degrees C. to around 300-400 degrees C. to provide a change of size in the order of 0.2-0.4 percent, i.e. 0.4-0.8 mm. Also, whereas a typical substrate nay be made from aluminum, having a temperature coefficient of $24*10^{-6}$/F, the stamp may be made from nickel having a temperature coefficient of $11*10^{-6}$/F. This causes difficulties in the operation of lithography equipment, since the heat expansion of the substrate may be twice as large as the heat expansion of the stamp.

One example of a situation where it may be very important that the stamp and the substrate are accurately aligned is where several patterns are to be provided on one substrate, e.g. through a plurality of lithography operations. Another example is the situation with a double-sided substrate, where the patterns provided on the two sides need to be aligned.

Prior art procedures and devices for alignment are provided in e.g. U.S. Pat. No. 5,669,303 and U.S. Pat. No. 5,947,027. According to these documents, the stamp is aligned optically by the use of a pattern that is arranged on the substrate.

The prior art methods and devices for aligning the substrate and the stamp do not take the heat expansion into adequate consideration. There is thus a need for a method and a device that enable accurate alignment and positioning of a stamp and a substrate, even when the size of the substrate changes as a consequence of it being heated.

SUMMARY OF THE INVENTION

An object of the invention is thus to provide a device and a method, which overcome the drawbacks of the prior art.

The object is at least partly achieved by embodiments set forth in the following description and in the claims.

According to a first aspect of the invention, there is provided a device for transferring a pattern from a stamp to a substrate, provided with a moldable film, by pressing the stamp and the substrate against each other. The device comprises at least one fixture for retaining a planar object such as said stamp or said substrate. The device is distinguished in that it comprises a heating element for heating said planar object, and a measuring arrangement for determining a change in the size of the planar object due to said heating.

A planar object is an object which has an essentially planar form, but which nevertheless may have a surface structure, such as a relief pattern, microelectronic structures or even recesses or through-holes. The planar object may be either the stamp or the substrate.

The heating element may be any device that enables a planar object to be heated. Such devices comprise, but are not limited to devices for heating the planar object directly, e.g. by passing an electrical current through the planar object, or indirectly, e.g. by providing a heating element from which heat is transferred to the planar object by e.g. induction, convection, radiation or conduction.

The measuring arrangement for determining the change in size may be any measuring arrangement for accurately measuring the change in size in the direction of the line between the two support members.

The arrangement according to the first aspect of the invention enables accurate determination of the change in the size of the planar object, which may easily be translated into a change in temperature and thus into an accurate determination of the temperature of the planar object. Based on this determination, it is possible to provide feedback for controlling the heating elements by which the planar object is heated. It is also possible to utilize the determination of change in the size for aligning e.g. a substrate and a stamp, as will be further described below.

The device may further comprise means for determining a temperature of the planar object based on said change in the size. Such means may be e.g. a signal processor, a programmable general processor or some other circuitry that is arranged to determine the temperature based on the change in size and e.g. the temperature coefficient of the planar object.

In one embodiment, the measuring arrangement may comprise at least one pair of support members, which are arranged at predetermined portions of the planar object, e.g. at opposite edge portions. Each support member may be arranged to interact with the planar object in a respective contact portion and each pair of support members may be arranged for determining a distance between the contact portions associated therewith. The device may comprise comprises at least two such pairs of support members.

A contact portion is the area where the support member interacts with the planar object, i.e. the substrate or the stamp. Thus, the contact portion may be the contact surface between the planar object and the support member. The contact portion may be an axis of any angle relative to the principal plane of the planar object, e.g. orthogonal, and around which a turning movement between the planar object and the support member may take place.

Thus, in the case where the substrate is e.g. circular and the portion of the support member that interact with the substrate has a triangular cross-section, the contact portion would be the point in which the tip of the triangle meets the substrate. However, since the support member may be arranged to interact with the substrate or stamp in many different ways, the term contact portion should be interpreted in a broader sense, such as a rotatable joint between a support member and an adapter that is placed on the planar object.

According to a second aspect of the invention, there is provided a method for transferring a pattern from a stamp to a substrate, provided with a moldable film by pressing the stamp and the substrate against each other, the method comprising arranging the stamp and the substrate in a respective fixture which is adapted for supporting a planar object such as the stamp or the substrate. The method is distinguished by the actions of heating at least one of said stamp and said substrate, determining a change in the size of at least one of said stamp and said substrate, and pressing the stamp and the substrate against each other for transferring said pattern to said moldable film.

The method may further comprise determining a temperature of the planar object based on the change in the size.

The method may also comprise determining the change in the size comprises determining the change in size along at least two axes in a main plane of said planar object.

According to a third aspect of the invention, there is provided a device for transferring a pattern from a stamp to a substrate, provided with a moldable films, by pressing the stamp and the substrate against each other. The device comprises at least one fixture for retaining a planar object such as the stamp or the substrate. The device is distinguished in that the at least one fixture comprises first and second support members, that are arranged to interact with first and second edge portions of the planar object, at first and second contact portions, respectively. The contact portions are essentially torque-free in at least a principal plane of the planar object. The support members are displaceable relative to each other along first and second displacement vectors. Finally, the displacement vectors, when projected onto said principal plane, form a straight line, on which projections of said contact portions are situated.

The principal plane of the planar object is the surface plane (i.e. the plane containing the relief pattern in the case of the stamp or the plane containing the moldable film in the case of the substrate), or any plane which is essentially parallel to the surface plane. Essentially parallel means that the surface plane may have small variations in thickness due to the relief pattern or due to prior process steps having been carried out.

The contact portion is essentially torque free in the principal plane, i.e. the contact portion where the interaction between the substrate and the support member cakes place is not capable of transferring any torque which could cause shear stresses in the planar object, and which might thus affect the thermal expansion of the planar object when heated.

Torque-free in the principal plane means that the contact portions do not transfer any torque to the rotational axis (whether virtual or physical), which is orthogonal to the principal plane.

The arrangement of the support members according to the third aspect provides a well defined fastening geometry, which prevents the stamp and/or substrate from horizontal movements such as twisting or turning in the fixture. Thus, the expansion or shrinkage of the stamp or substrate due to a change in temperature, will be essentially unimpeded, while still remaining well defined and measurable in a single dimension.

In one embodiment of the invention, the line is comprised in the principal plane, the support members being displaceable relative to each other along said straight line, and the contact portions being situated on the line.

The device may comprise a first fixture for retaining the substrate, and a second fixture for retaining the stamp.

Furthermore, the device may comprise a reference axis, which is arranged for aligning the first and second fixtures relative to each other. The reference axis may be an axis along which the fixtures are displaceable, e.g. for connection with pressing them together and separating them for replacing the stamp or substrate. The reference as may also be a virtual axis, i.e. a geometrical or theoretical axis against which two fixtures may be aligned with each other.

The device may further comprise a measuring arrangement far determining a distance between said first and second contact portions. The measuring arrangement may be any measuring device that is capable of accurately measuring the thermal expansion of the substrate and/or stamp. The measuring arrangement may be arranged to provide a signal representing the distance between the contact portions. Based on a result from the measuring arrangement, it is possible to determine e.g. the temperature of the stamp or substrate.

At least one of the support members may be biased towards the other support member. Biasing the support members against each other provides a simple way of ensuring that the stamp or substrate does not slip sidewise from the line between the contact portions. It may also act as to ensure a tight fit between the support members and the stamp/substrate.

In one embodiment, the first support member is arranged in a stationary position on said fixture, whereby the first contact portion thus provides a reference point. The second support member is displaceably arranged on said fixture, whereby the second contact portion thus provides a displaceable point. Having a stationary support member may simplify the design of the fixtures. Having only one displaceable support member may also simplify the design of the measuring arrangement.

The device may also comprise means for determining a respective position of the displaceable support member of the first and second fixtures. It may further comprise means for determining, based on the positions, a respective temperature of the stamp and the substrate. It may also comprise a heating element for heating the planar object to a predetermined temperature. The arrangement with a stationary support member providing a reference point, also facilitates alignment of two or more fixtures, and thus the alignment of a substrate and one or more stamp. By also aligning the lines along which the displaceable support members may move, only a one-dimensional measurement of the heat expansion of the substrate or stamp is needed for determining its change in size and, knowing its temperature coefficient, also its change in temperature.

By making the heating element responsive to the heat expansion of the stamp or substrate, it is possible to accurately control the size of the stamp/substrate ad thus to align a stamp and a substrate.

According to another embodiment of the invention, the device comprises a third fixture, which is adapted for retaining a second star, wherein the first fixture is adapted for retaining a double-sided substrate, which is provided with first a second moldable films. Thus, a double-sided substrate may also be processed and aligned with its respective stamps in accordance with what was described above.

According to a fourth aspect of the invention, there is provided a method for transferring a pattern from a stamp to a substrate, provided with a moldable film by pressing the stamp and the substrate against each other. The method comprises arranging the stamp and the substrate in a respective fixture which is adapted for supporting a planar object such as the stamp or the substrate. The method is distinguished in that it comprises the actions of:

arranging the planar object between first and second support members in the fixture, such that said support members interact with first and second edge portions of said planar object in first and second contact portions, respectively, arranging said contact portions in an essentially torque-free manner in at least a principal plane of the planar object;

arranging said support members displaceably relative to each other along first and second displacement vectors, said displacement vectors, when projected onto said principal plane, forming a straight line, on which projections of said contact portions are situated;

heating at least one of said stamp and said substrate to; and pressing the stamp and the substrate against each other for transferring said pattern to said moldable film.

The arrangement of the support members provides a well defined fastening geometry, which prevents the stamp and/or substrate from twisting or turning in the fixture. Thus, the expansion or shrinkage of the stamp or substrate due to a change in temperature, will be essentially unimpeded, while still remaining well defined and umeasurable in a single dimension.

According to a fifth aspect of the invention, there is provided a device for transferring a pattern from a stamp to a substrate, provided with a moldable film, by pressing the stamp against the substrate. The device comprises at least one fixture for retaining a planar object such as said stamp or said substrate. The device is distinguished in that the at least one fixture comprises first and second support members, that are arranged to interact with said planar object at first and second contact portions, respectively. The device is further distinguished in that the contact are essentially torque-free in at least a principal plane of the planar object, and in that the support members are displaceable relative to each other along a straight line, which is comprised in the principal plane, and on which said contact portions are situated.

According to a sixth aspect of the invention, there is provided a method for determining the temperature of a template or a substrate in a pattern transfer process. The method is distinguished in the temperature is determined based on a detection of a change in the size of said template or substrate.

A pattern transfer process may be any process for transferring a pattern from a template to a substrate. Such processes include, but are not limited to, the lithography processes discussed above and methods using electromagnetic radiation which is passed through a partially transparent template. In a preferred embodiment of this sixth aspect, the changes in the size is determined in a principal plane of said template or substrate.

BRIEF DESCRIPTION OF THE DRAWINGS

The invention will now be described in more detail with reference to the appended drawings, which illustrate embodiments of the invention.

FIGS. 7*a-f* are schematic drawings of a detail of the fixtures shown in FIGS. 1-4 and 6.

DETAILED DESCRIPTION OF EMBODIMENTS OF THE INVENTION

Figure 1:
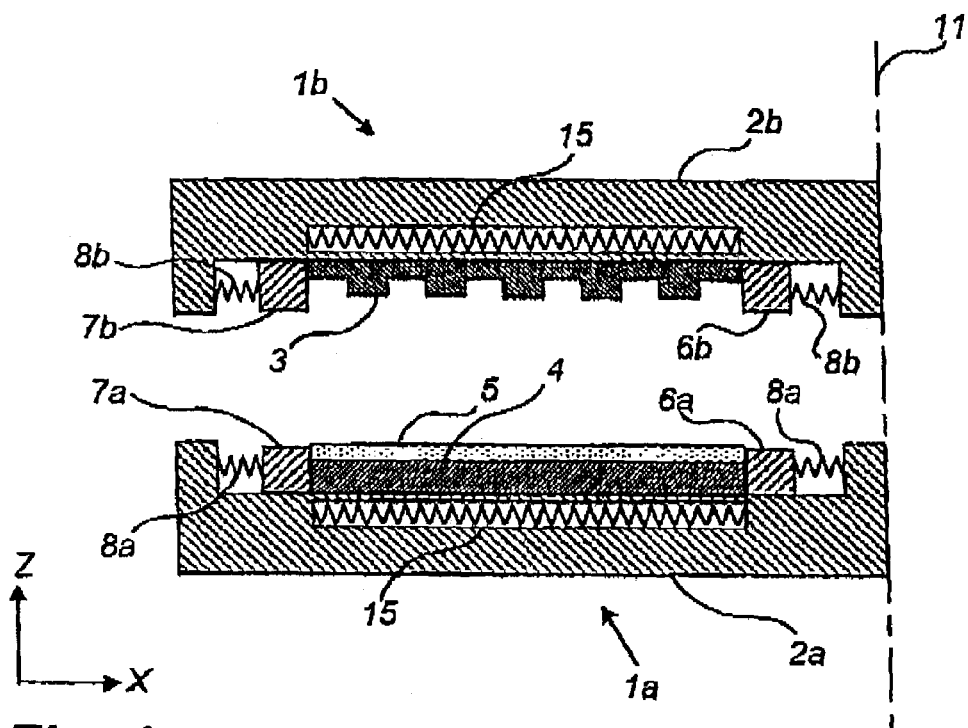
FIG. 1 is a schematic cross-sectional view of an imprint lithography device according to a first embodiment of the invention.

The following description will be given with reference to a three-dimensional coordinate system, which is defined in FIGS. 1-6. It is realized that the devices and methods according to the invention are not limited by the illustrated coordinate system, and that the device may, for example, be given a different spatial orientation.

In the description, similar elements will be designated with the same reference numerals.

FIG. 1 is a schematic cross-sectional view of an imprint lithography device according to a first embodiment of the invention.

Figure 2:
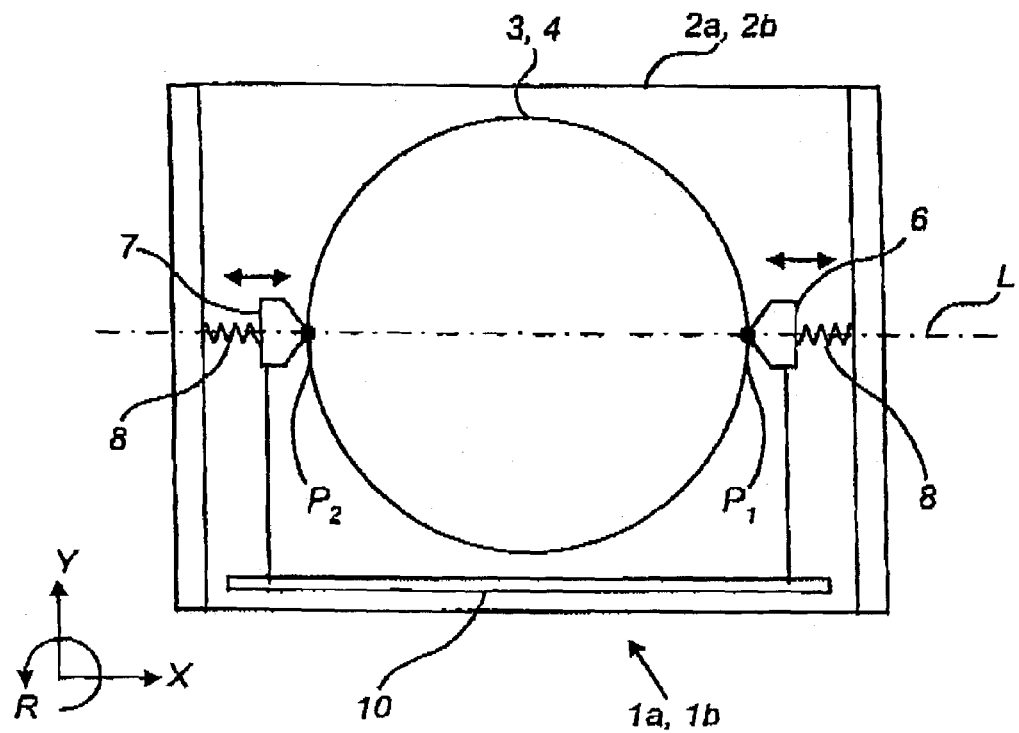
FIG. 2 is a schematic top view of a fixture according to the embodiment of the invention shown in FIG. 1.

FIG. 2 is a schematic top view of a fixture according to the embodiment of the invention shown in FIG. 1. The cross-section of FIG. 1 is made along the line L of FIG. 2. The fixture may be used to retain either a substrate or a stamp.

The device according to this first embodiment comprises two fixtures 1a, 1b, which are displaceable relative each other along a reference axis 11. Each fixture comprises a fixture frame 2a, 2b, which is mounted on the axis 11, such that at least one of the fixtures 2a, 2b is displaceable along the axis 11, i.e. parallel with the Z-axis of the coordinate system.

The fixture frame 2a, 2b is adapted for retaining a planar object, such as a stamp 3 or a substrate 4. The stamp 3 typically has a relief pattern (as illustrated by the structures portion in FIG. 1), whereas the substrate 4, is provided with a moldable film 5. For a more detailed description of the stamp 3 and the substrate 4, reference is made to the prior art documents mentioned above.

The planar object typically exhibits a principal X-Y plane, which coincides with e.g. its surface. In order to retain the planar object in this plane, the fixtures 1a, 1b are provided with two support members 6a, 6b, 7a, 7b.

Since the following description of these support members is applicable to both fixtures, the support members will merely be referred to by the reference numerals 6 and 7 and the fixture will be referred to as 1 etc. Equally, since the description applies both to the stamp 3 and the substrate 4, reference to those will be made by the general term "planar object".

Each support member 6, 7 is arranged to interact with the planar object 3, 4 in an essentially torque-free manner in the principal plane X-Y of the planar object. Thus, each individual support member 6, 7 would not cause the planar object to turn or pivot horizontally around its contact portion.

The two support members 6, 7 are arranged on opposite sides of the planar object 3, 4. The support members are displaceable relative to each other along a line L (FIG. 2), on which both contact portions ($P_1$, $P_2$—FIG. 2) are situated. The displaceability may be achieved by arranging the support member(s) in a track or in a piston-like manner, such that it is prevented from performing anything but a linear movement along the line L (FIG. 2). A linear bearing may be provided in order to decrease friction between the support member 6, 7 and the fixture body 2.

Furthermore, the support members 6, 7 are arranged to interact with the planar object 3, 4 in a manner that prevents the contact portion from migrating (e.g. slipping) along the edge of the planar object.

One alternative way of achieving this is to bias at least one of the support members 6, 7 such that it will exert a force along the line L (FIG. 2), which force is enough to prevent the planar object from slipping in a direction perpendicular to the X-Z plane, i.e. along the Y-axis (FIG. 2). The biasing means is schematically illustrated by a helical spring 8, but other types of biasing means are also possible, such as gas springs, blade springs, electromagnetic actuators etc, the important function being to provide the force along the line L (FIG. 2). Alternative ways of achieving this are provided below, with reference to FIGS. 7a-c.

Since imprint lithography may be facilitated by the moldable film being heated, the fixture 1 may be provided with a heating element 15 for heating the planar object. For a more detailed description of the heating element 15, reference is made to the prior art documents mentioned above. The heating may be achieved by e.g. passing a electrical current through a metal plate that is arranged adjacent the planar object 3, 4. Alternatively, the planar object may comprise an electrically conductive material, through which the current is passed. Other ways of heating are conceivable, such as inductive heating, microwaves or introduction of heated fluids. The heating element may be controlled by e.g. a current level or a square-wave current.

The heating of the planar object 3, 4 is usually associated with a change of its size, typically an expansion, i.e. the planar object becomes bigger. The displaceable arrangement of the support members 6, 7 allows for the planar object 3, 4 to expand (or shrink) along the line L as a result of it being heated (or cooled). Furthermore, since the support members 6, 7 interact with the planar object in a torque-free manner and in a manner that prevents the contact portion from migrating (e.g. slipping) along the edge of the planar object, the expansion of the planar object will be linear along the line L. Thus, an arbitrary point which is situated on the line L, between the contact portions $P_1$ and $P_2$ (FIG. 2), will remain on the line L throughout the expansion of the planar object 3, 4.

The fixture frame 2a, 2b may further be provided with a prior art fluid pressure means (not shown), which by applying a fluid pressure to a back side (not shown) of the planar object (i.e. the stamp 3 and/or the substrate 4) provides a uniform pressure over the entire printing surface. The pressure means may also be used to retain the planar object 3, 4 in the vertical (Z) direction when the fixtures 1a, 1b are spaced apart, e.g. in connection with a shifting of stamps or substrates. This may be achieved by providing a pressure on the back side of the planar object, which is lower than the surrounding pressure, such that a vacuum or a partial vacuum is provided. Other means of retaining the planar object(s) are also conceivable, such as a protrusion on the support members 6, 7.

As is schematically illustrated in FIG. 2, the fixture 1 may be provided with a measuring arrangement 10 for determining the position of the support members 6, 7 along the line L. The measuring arrangement 10 may be a high-precision measuring arrangement for accurately measuring very small distances. Such an arrangement may be e.g. optical (interferometry, laser etc.) or electronic (piezo device etc.). Furthermore, optical or capacitive rulers may be used.

Based on an output from the measuring arrangement 10, it is possible to determine the displacement of the support members 6, 7 relative to each other, e.g. when the planar object 3, 4 is heated. Thus, the expansion of the planar object 3, 4 may be accurately determined.

Once the thermal expansion along the line L is known, it is possible to predict the movement, due to the expansion, of an arbitrary point on the line L. As will be described later, with reference to FIG. 5, this may be used when aligning e.g. a stamp 3 and a substrate 4.

Furthermore, based on the knowledge of the expansion, along with knowledge of the temperature coefficient of the planar object, the temperature of the planar object may be accurately determined, both while heating the planar object and while cooling it. Thus, it is made possible to both heat the planar object at a predetermined rate and cool it at a predetermined rate, e.g. in order to avoid damages to the planar object due to rapid and/or non-uniform cooling. It may be particularly advantageous to control the cooling such that the cooling of the substrate and the stamp is uniform, especially in a case where the stamp needs to be maintained in contact with the substrate during the cooling phase in order for the transferred pattern to settle properly.

The fixtures 1a, 1b may optionally be displaceable relative to each other in other directions, such as along the X-axis or the Y-axis. The fixtures may also be pivotable relative to each other, e.g. around the Z-axis. Such displaceability may be advantageous when aligning the stamp 3 and the substrate 4 or when shifting substrates or stamps. The displacement along the axes X, Y and Z may be provided by means of prior art actuators (not shown), which may be mechanically or manually controlled.

The fixtures 1a, 1b may be essentially similar, but they may also vary with respect to dimensions and other features Needless to say, the device may also be provided with prior art alignment equipment for, e.g. optically aligning the stamp 3 and the substrate 4.

Figure 3:
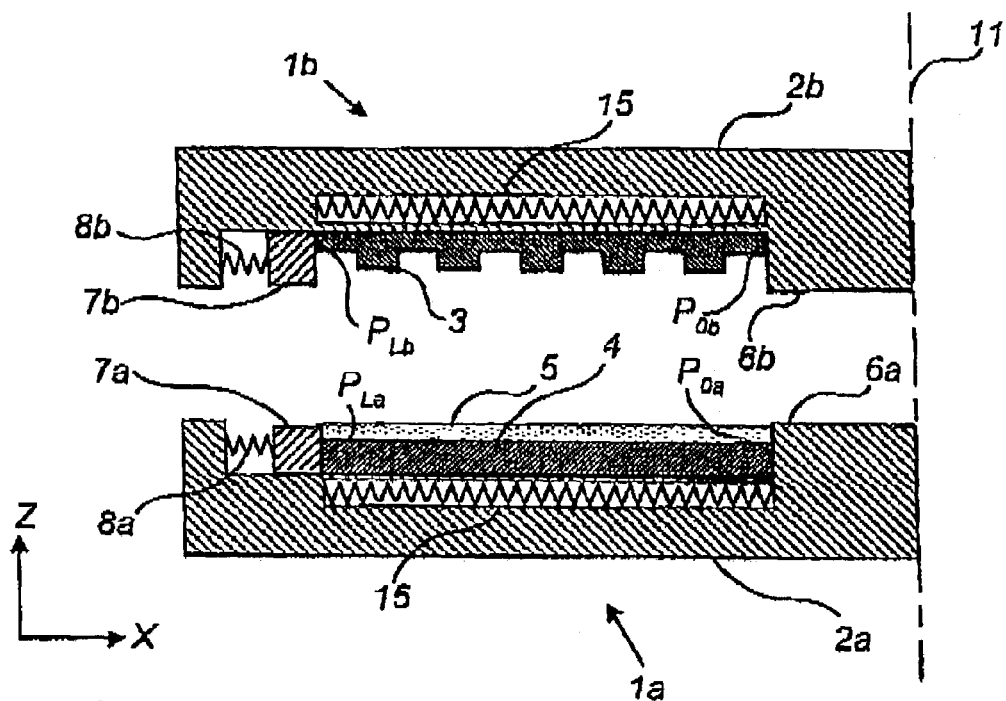
FIG. 3 is a schematic cross-sectional view of an imprint lithography device according to a second embodiment of the invention.

FIG. 3 is a schematic cross-sectional view of an imprint lithography device according to a second embodiment of the invention. The embodiment shown in FIGS. 3 and 4 essentially functions in the same manner as the one described above, the main difference being that in this embodiment, one support member is stationary and the other one is displaceable.

According to this second embodiment, one support member 6 is arranged to be stationary on the fixture frame 2, while the other support member 7 is displaceably arranged according to what was described above with reference to FIGS. 1 and 2.

When viewing the planar object from above, the contact portions may be represented as torque-free contact points, around which a turning of the planar object relative to the support member would be possible if the planar object had not been supported by two support members. Thus, when referring to contact points, what is meant is the theoretical points around which the turning would take place.

The stationary support member 6 provides a reference point $P_0$ at its contact portion $P_1$ on the periphery of the planar object 3, 4, while the measuring arrangement 10 only needs to be arranged for determining the position of the displaceable support member 7, whose associated contact portion $P_2$ thus constituting a displaceable point $P_L$.

The reference point $P_0$ provided by the arrangement of the stationary support member 6 may also facilitate the coordination, e.g. by means of the reference axis 11, with other fixtures, such as between the fixtures 1a and 1b in FIG. 3.

Figure 4:
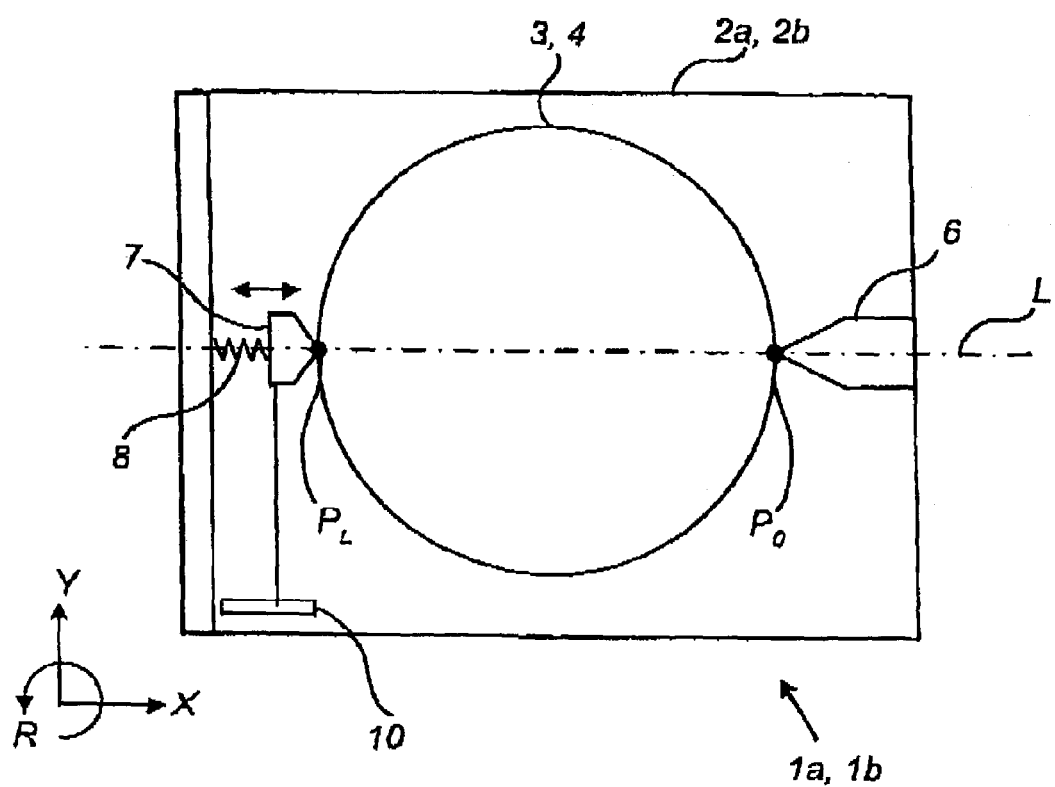
FIG. 4 is a schematic top view of a fixture according to the embodiment of the invention shown in FIG. 3.

FIG. 4 is a schematic top view of a fixture according to the embodiment of the invention shown in FIG. 3.

Analogously with the embodiment described with reference to FIGS. 1 and 2, the fixture shown in FIG. 4 may be used to retain either a stamp 3 or a substrate 4.

In FIG. 4, the contact portions $P_0$ and $P_L$ are clearly illustrated, $P_0$ constituting a reference point that is associated with the support member 6 that is stationary on the fixture frame 2a, 2b, and $P_L$ constituting a displaceable point that is associated with the displaceable support member 7. The measuring arrangement 10, which is schematically indicated need only be arranged to measure the displacement of the displaceable support member 7, i.e. the contact portion $P_L$.

Figure 5:
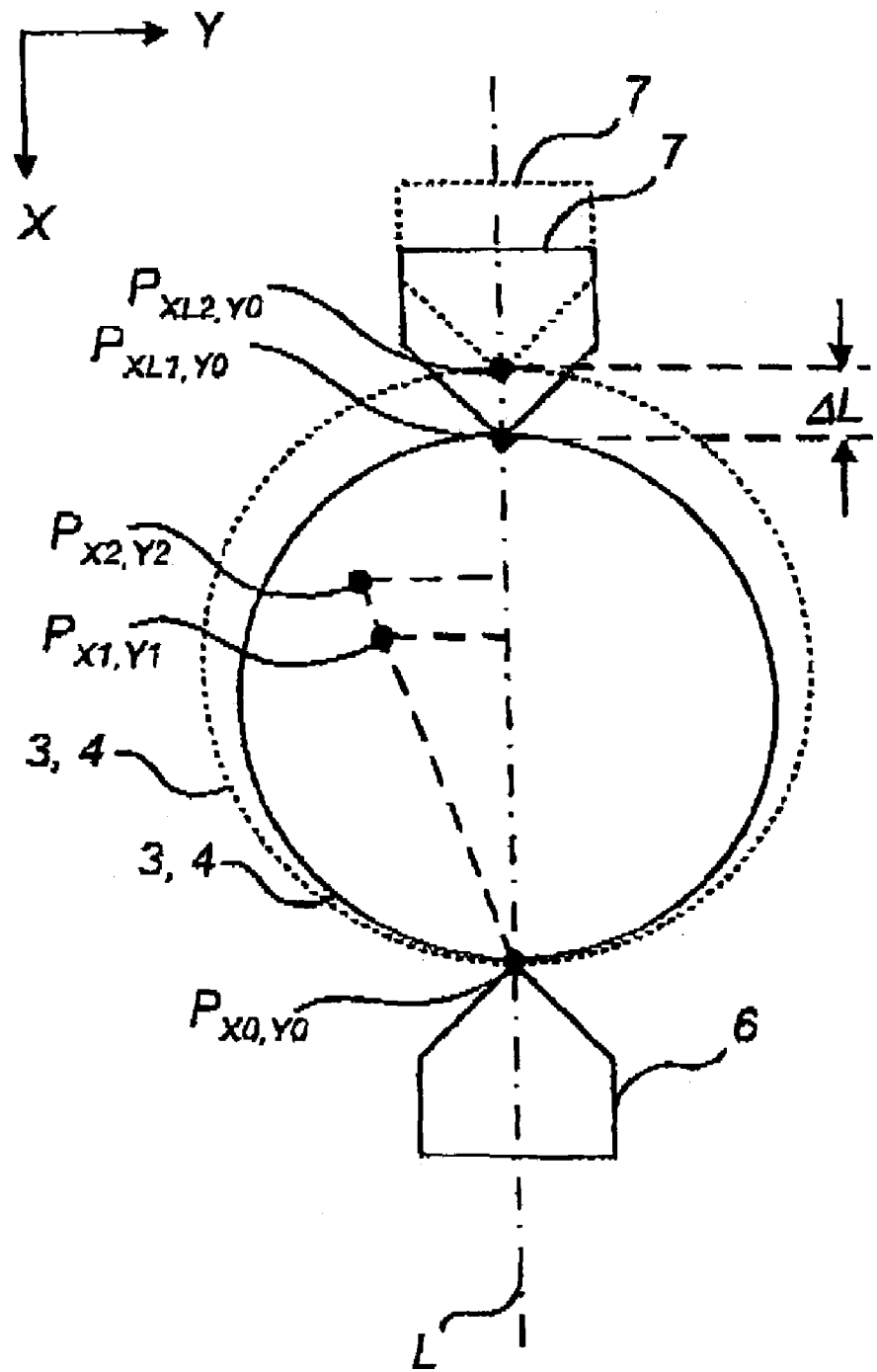
FIG. 5 is a schematic diagram of a substrate or a stamp which is arranged in a fixture according to the invention and which is subjected to heating.

FIG. 5 is a schematic diagram of a substrate or a stamp which is arranged in a fixture according to the invention and which is subjected to heating. The continuous line represents the planar object 3, 4 prior to heating, while the dotted line represents the planar object subsequent to the heating. It will be appreciated that the magnitude of the expansion has been grossly exaggerated, in order to make the illustration more clear. In a real application, the expansion may be in the order of 0.01-2 percent.

FIG. 5 further shows how the planar object 3, 4 is arranged between the support members 6, 7, the first support member 6 being stationary and providing a reference contact portion, which in FIG. 5 is designated $P_{X0, Y0}$. The second support member 7 is displaceable along the line L, according to what was described above, thus providing the displaceable contact portion, which in FIG. 5 is designated $P_{XL1, Y0}$ and $P_{XL2, Y0}$ prior to and after heating, respectively.

Since the planar object 3, 4 is retained between two points $P_0$ and $P_L$, no turning or twisting of the planar object will occur as it is allowed to expand during the heating. Instead, each point on the substrate will be displaced linearly from the contact portions $P_0$ and $P_L$. In the example given, $P_0$ is stationary relative to the fixture 1. Furthermore, it is assumed that the material of the planar object is isotropic with regard to its heat expansion properties, i.e. it has the same temperature coefficient in all directions of its principal plane X-Y. Thus, all points on the planar object will be regarded as being displaced radially from the reference point $P_0$.

In this example, an arbitrary point $P_{X1, Y1}$, having the coordinated X1, Y1 will be regarded. As the planar object is heated, the point $P_{X1, Y1}$ will migrate radially away from $P_0$ to a new position $P_{X2, Y2}$, having the coordinates X2, Y2. Meanwhile, the point $P_{XL2, Y0}$, having the coordinates XL1, Y0 will migrate to $P_{XL2, Y0}$, having the coordinates XL2, Y0. The migration of $P_{XL1, Y0}$ to $P_{XL2, Y0}$ is measured by the measuring arrangement 10, which essentially measures the distance $\Delta L$. Thus, based on the coordinates of $P_{XL1, Y0}$ and $P_{XL2, Y0}$ the coordinates for $P_{X2, Y2}$ may be determined according to the following mathematical relationship.

$$\frac{XL2 - X0}{XL1 - X0} = \frac{X2 - X0}{X1 - X0} = \frac{Y2 - Y0}{Y1 - Y0} \qquad (1)$$

This mathematical relationship may, for example, be utilized for e.g. determining the positions of alignment marks, i.e. reference points that may be provided on stamps 3 and substrates 4 for facilitating alignment thereof.

It is realized that whereas prior art devices normally require several alignment marks, e.g. four or six marks, the fixture according to the invention requires only one alignment mark and one reference point $P_0$, since all points on the planar object are bound to migrate according to the relationship (1) above as the planar object is heated.

Referring once again to FIGS. 3 and 4, the fixtures 1a, 1b may be arranged ouch that the reference points $P_{0a}$ and $P_{0b}$ are coordinated, i.e. have the same X- and Y-coordinates in the coordinate system. Thus, the reference points $P_{0a}$ and $P_{0b}$ may be vertically aligned, by means of e.g. the reference axis 11. Furthermore, the line L and the support members 7a, 7b (and thus the displaceable points $P_{La}$ and $P_{Lb}$) of the fixtures 1a, 1b may be aligned as well, such that they have the same X- and Y-coordinates in the coordinate system. This arrangement would guarantee that a stamp 3 and a substrate 4 are perfectly aligned in their respective reference points $P_{0a}$ and $P_{0b}$, and that their thermal expansions along the line L would be measurable.

The ability of accurately measuring the thermal expansion of the planar object 3, 4, together with knowledge of the temperature coefficient of the material of the planar object, provides an opportunity for determining the temperature of the planar object. This way of measuring the temperature may be advantageous since it in some instances may be difficult, or even impossible, to measure the temperature of the planar object 3, 4, due to the difficulty of arranging temperature sensors in the relevant places. Thus, the planar object may be monitored in order to ascertain that it has the right temperature for the processing.

The temperature may be used as a feedback signal, based on which the heating element 15 may be controlled. Thus, a control loop comprising the heating element 15, the measuring arrangement 10 and control circuitry (not shown) is formed.

Furthermore, the heating element 15 and measuring arrangement 10 may be used to accurately control the size of the planar object based on the signal from the measuring arrangement 10. This control of the size may be used for accurate alignment of the stamp 3 and the substrate 4, e.g. in a manner as described below.

Figure 8:
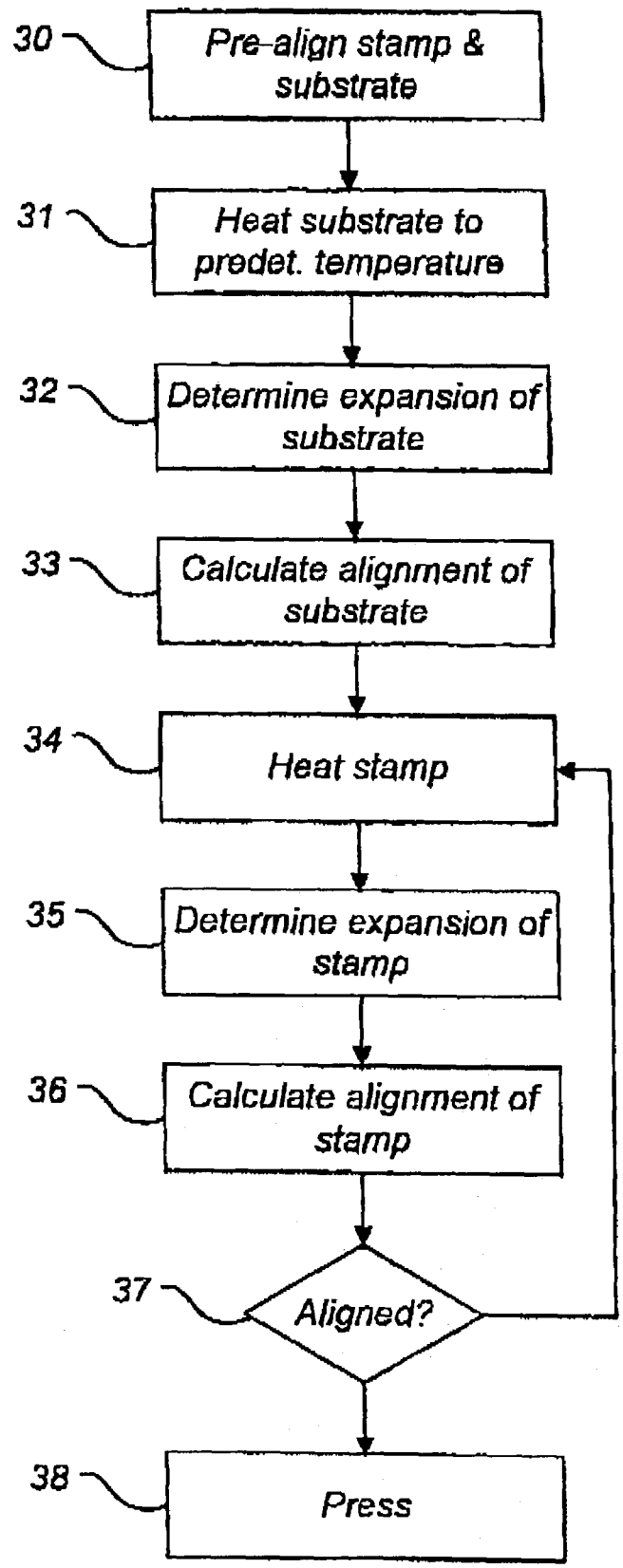
FIG. 8. is a schematic flowchart a method according to an aspect of the invention.

A method for such alignment will be described with reference to FIG. 8.

In a first step 30 the stamp 3 and the substrate 4 are arranged in the respective fixtures 1a, 1b. The stamp and the substrate may be aligned according to any prior art alignment technique, such as by using an alignment pattern (not shown) on the substrate 4, which is optically aligned with a corresponding pattern (not shown) on the stamp 3. The alignment technique described above may also be used. The invention, however, is not limited to this alignment technique. In connection with the alignment, the reference points $P_{Oa}$ and $P_{Ob}$ are aligned, as are the respective lines L along which the stamp 3 and the substrate 4 will expand.

Once the stamp 3 and the substrate 4 are aligned, the substrate 4 is heated, in step 31, to a predetermined temperature for facilitating the molding of the film 5. Once the predetermined temperature has been reached, it may be maintained throughout the process.

In step 32, the expansion of the substrate is determined based on a signal from the measuring arrangement 10.

In step 33, new positions for an alignment pattern on the substrate 4 are calculated, e.g. as described above, based on the expansion of the substrate 4.

In step 34, the stamp 3 is heated in order to expand to a degree such that the alignment pattern of the stamp 3 will correspond to the alignment pattern of the substrate 4.

While the stamp 3 is heated, its expansion is determined in step 35, in a manner similar to step 32. Based on the determination of the expansion, new positions for the alignment pattern of the is calculated in step 36. In step 37, the alignment pattern of the stamp 3 is compared with the alignment pattern (not shown) of the heated substrate 4. Once the two patterns have been determined to coincide, i.e. the substrate 4 and the stamp 3 are aligned, the temperature of the stamp 3 may be maintained. Thus, a feedback loop is utilized when heating the stamp, such that the alignment pattern is continuously recalculated as the stamp is heated. As an alternative, a temperature at which the alignment pattern of the stamp 3 will correspond to that of the substrate 4 may be calculated based on the temperature coefficient of the stamp. A combination of the two methods is also possible, e.g. by making a first rough calculation of at which temperature the patterns should coincide, then heating the stamp to that temperature and subsequently using the feedback method to fine-tune the alignment.

In step 38, the stamp 3 is pressed against the substrate 4 to transfer the relief pattern.

While reference is made to an alignment pattern, it is realized that the alignment pattern used in steps 32-37 need not be the same as that used in step 30. In fact, the alignment pattern may be virtual, such that arbitrary positions are chosen and utilized for calculation of the alignment. One example is the use of a single point along the line L as an alignment point. As another alternative, the alignment may be based entirely on the relationship between the expansion of the stamp 3 and the substrate 4, i.e. the stamp 3 and the substrate 4 are considered to be aligned when they have expanded to a certain degree.

Figure 6:
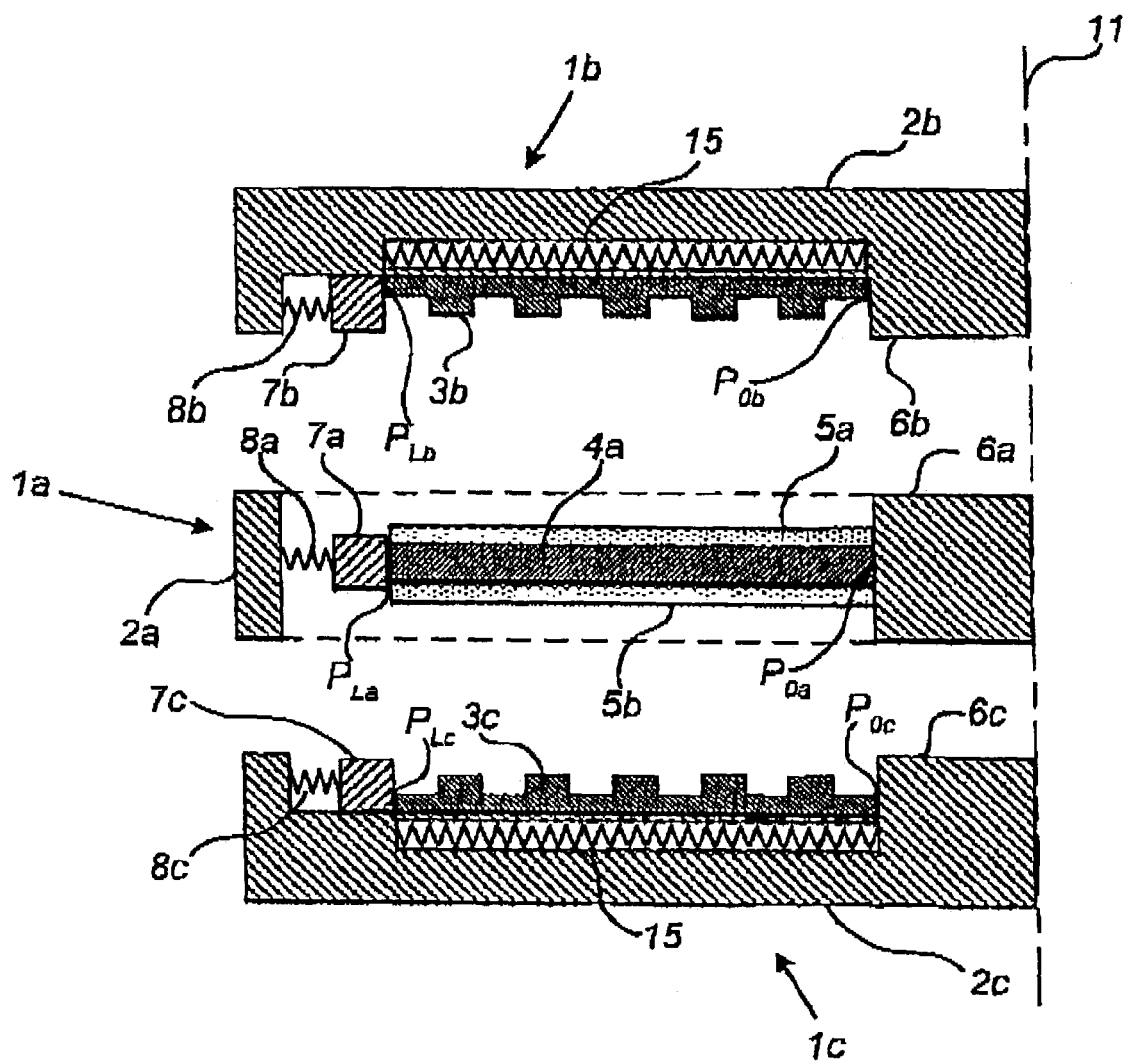
FIG. 6 is a schematic cross-sectional view of an imprint lithography device according to a third embodiment of the invention.

FIG. 6 is a schematic cross-sectional view of an imprint lithography device according to a third embodiment of the invention.

In this embodiment, Three fixtures 1a, 1b, 1c are arranged along a reference axis 11. A first fixture 1a is adapted for retaining a double-sided substrate 4a, being provided with first 5a and second 5b moldable films. A second 1b and a third 1c fixture are arranged on opposite sides of the first fixture 1a, such that the stamps 3b and 3c that are retained in those fixtures facing the respective sides of the double-sided substrate 4. Heating elements 15 are arranged in the second 1b and third 1c fixtures, as well in the first fixture 1a. For clarity, the heating element of the first fixture has been left out. It is realized that this heating element (not shown) may be provided in the manner described above. Support members, 6a, 6b, 6c, 7a, 7b, 7c may also be arranged in a manner similar to FIGS. 1-4.

Similarly to the embodiments described with reference to FIGS. 1-4, the fixtures 1a, 1b, 1c are aligned along the reference axis 11, such that reference points $P_{Oa}$, $P_{Ob}$ and $P_{Oc}$ of the respective fixtures 1a, 1b, 1c are aligned in the X-Y-plane. The lines L (not shown in FIG. 6) are also aligned, such that the measuring arrangements (not shown in FIG. 6) will determine the positions $P_{La}$, $P_{Lb}$, $P_{Lc}$ of the displaceable supports members 7a, 7b, 7c and thus measure the expansion of the stamps 3b, 3c and the substrate 4 along the line L.

FIGS. 7a-c are schematic drawings of a detail of the fixtures shown in FIGS. 1-4 and 6. Generally, the support members 6, 7 should interact with the planar object 3, 4 in an essentially torque-free manner, in the principal plane of the planar object 3, 4. Thus, FIGS. 7a-c illustrate different means for achieving this torque-free contact portion.

In FIG. 7a, a first embodiment of the arrangement of the support members 6, 7 against the edge of the planar object is described. According to this embodiment, the friction between the support member and the edge is sufficient to prevent the planar object form slipping from the support member. Possibly, this could be facilitated by a deformation, elastic or plastic, of the edge of the planar object 3, 4. However, the deformation should not be so large as to jeopardize the torque-free connection.

FIG. 7b illustrates a second embodiment of the arrangement of the support members 6, 7 against the edge of the planar object. Here, the edge of the planar object has been provided with a recess or a cut out portion, in which the support member is arranged, thus preventing the planar object 3, 4 from slipping off from the support member 6, 7. For example, the recess may be provided with a centre angle that is larger than the angle of the point of the support member, such that the support member 6, 7 remains pivotable within the recess.

FIG. 7c illustrates a third embodiment of the arrangement of the support member 6, 7 against the planar object 3, 4. Here, an adapter is fixedly arranged on the planar object, whereby the support member may be arranged to co-act with the adapter in a way similar to what was described above with reference to FIGS. 7a and 7b. Alternatively, as is illustrated in FIG. 7c, the support member 6, 7 and the adapter may be connected by a pivotable joint, such as a small bearing.

FIG. 7d illustrates a fourth embodiment of the arrangement of the support member 6, 7 against the planar object 3, 4. Here, a protrusion 16 on the edge of the planar object is fitted into a recess in the support member 6, 7. In a similar manner to e.g. the embodiment described in connection with FIG. 7b, the embodiment of FIG. 7d may provide an essentially linear contact, along an axis that is e.g. orthogonal to the principal plane (X-Y) of the planar object, between the support member 6, 7 and the planar object 3, 4. Alternatively, an essentially point-shaped contact may be provided in the case where the protrusion has a small extension in the direction orthogonal to the principal plane of the planar object.

Figure 7E:
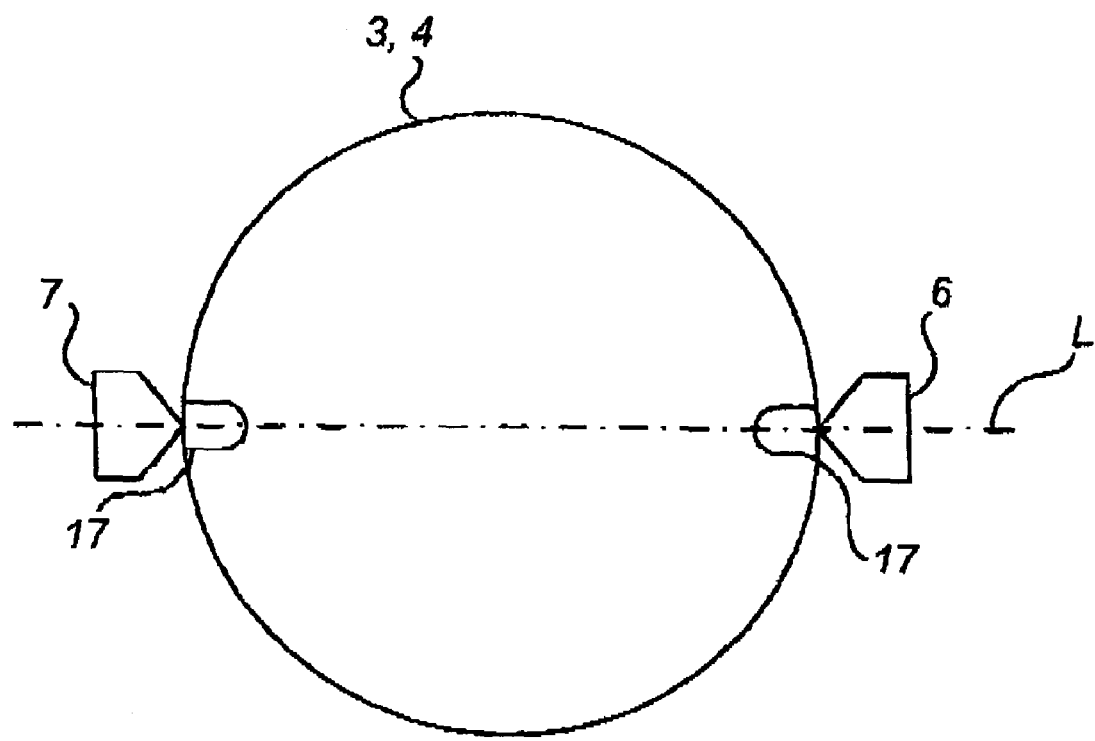
Figure 7F:
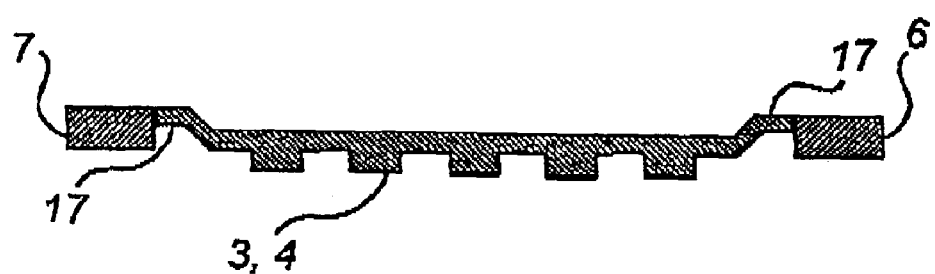

FIGS. 7e and 7f illustrate a fifth embodiment of the arrangement of the support member 6, 7 against the planar object 3, 4. Here, the edge portions of the planar object 3, 4, where the support members 6, 7 are to interact with the planar object, are provided with a recess 17 in a direction that is orthogonal to the principal plane (X-Y) of the planar object 3,4. The recess 17 enables the support members 6, 7 to interact with the planar object 3, 4 without protruding from the surface of the planar object, which reduces the risk of the support members interfering with a second planar object against which the planar object is pressed.

Although FIGS. 7e and 7f illustrate the embodiment implemented on a substrate, it will be appreciated that the embodiment may equally be implemented for a substrate.

Other types of connections between the support members 6, 7 and the planar object are conceivable and fall within the scope of the appended claims. The above described connections may also be combined.

Furthermore, the contact between the support member and the edge of the planar object may take on many forms. According to the embodiment illustrated in e.g. FIGS. 1-4 and 6, the contact may be described as a linear contact, i.e. it has essentially no extension along the X- and Y-axes, but it does have an extension along the Z-axis. Alternatively, the contact between the support members 6, 7 and the planar object may have essentially no extension along the Z-axis either, e.g. it the support member has the shape of a cone (not illustrated) with its tip directed towards the edge surface of the planar object.

Furthermore, the support members 6, 7 may be provided with means for preventing the planar object 3, 4 from slipping along the Z-axis. Such means may include a protrusion (not shown) on the upper part of the support member, or the linear contact surface of the support member 6, 7 may be inclined inwards, i.e. have a dovetail shape (not shown).

A support member that is to be a stationary support member may be formed in one piece with the fixture frame 2. Alternatively, it may be fabricated separately and attached to the fixture frame 2.

Figure 9:
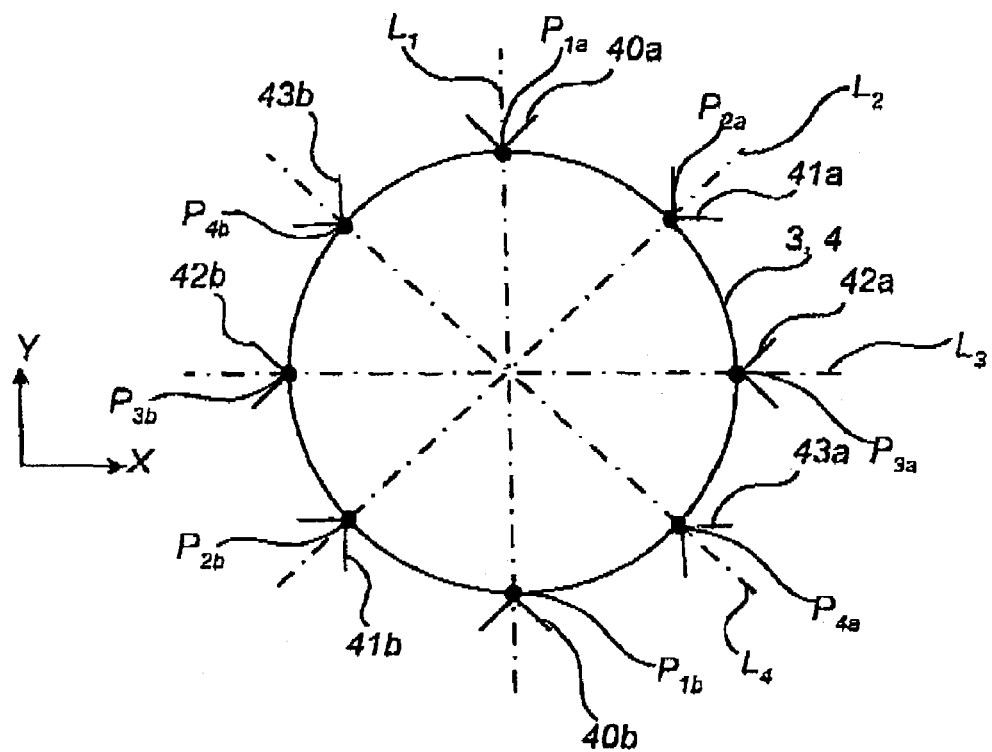
FIG. 9 schematically illustrates a arrangement for determining a change in the size of a stamp or a substrate.

FIG. 9 schematically illustrates an arrangement for determining a change in the size of a stamp 3 or a substrate 4 along a plurality of lines $L_1$, $L_2$, $L_3$, $L_4$.

In this arrangement, pairs of support members 40, 41, 42 and 43 are arranged to interact with opposite edge portions of the planar object. For example, a first pair 40 of support members comprises first and second support members 40a, 40b, which are arranged on opposite sides of the planar object. The support members 40a, 40b are arranged on a straight line $L_1$ between their respective contact portions $P_{1a}$ and $P_{1b}$.

Furthermore, the pair of support members are provided with a measuring arrangement (not shown), similar to what was described above, which is arranged for determining a change in the size of the planar object 3, 4 along the line $L_1$.

The other pairs of support members 41, 42 and 43 are arranged analogously with the first pair of support members 40, thus providing determinations of the change in size along their respective lines $L_2$, $L_3$ and $L_4$.

Thus, having knowledge of the temperature coefficient of the material of the planar object 3, 4, it is possible to determine the temperature along each line $L_1$, $L_2$, $L_3$ and $L_4$, analogously with what was described above. If the determined temperature is found to differ between two lines, this might be an indication to the effect that I) the temperature is not uniform or ii) that the temperature coefficient of the material varies, which in turn may indicate contaminations of the material.

The support members of the embodiment of FIG. 9 may be designed analogously with those described above.

Figure 10:
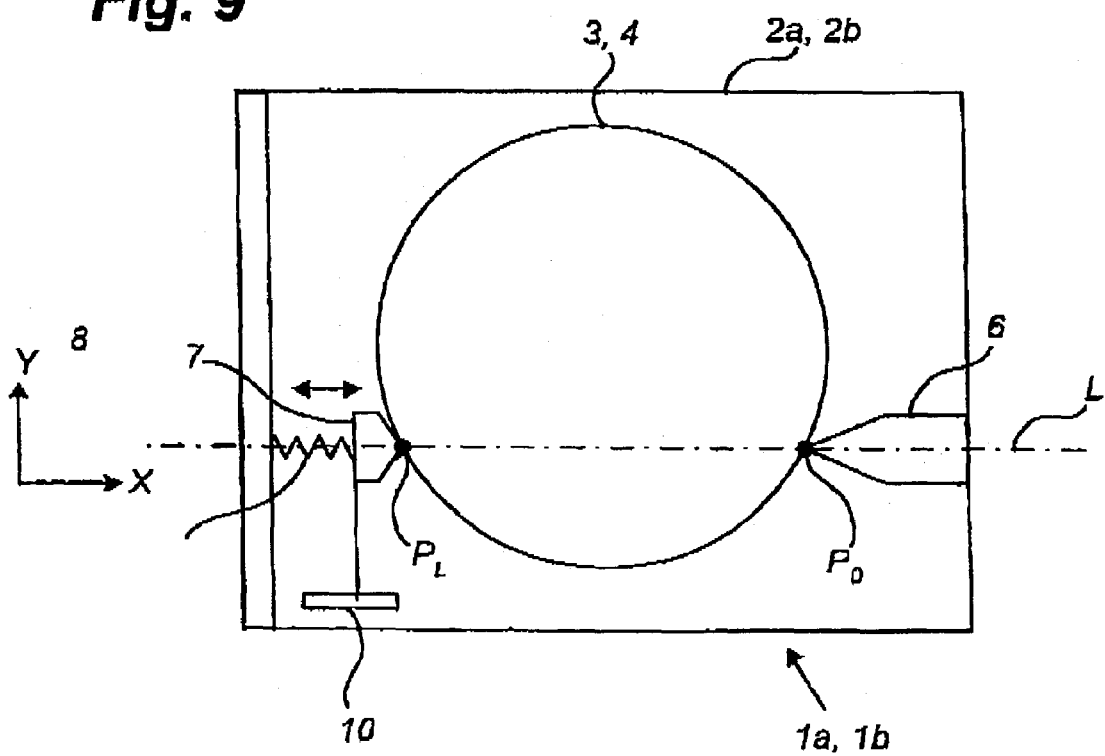
FIG. 10 schematically illustrates an alternative embodiment of the invention.

FIG. 10 schematically illustrates an alternative embodiment of the invention, wherein the line L does not run through the planar object's center of gravity. It is appreciated that any two points on the planar object 3, 4 may be used as contact portions.

Figure 11:
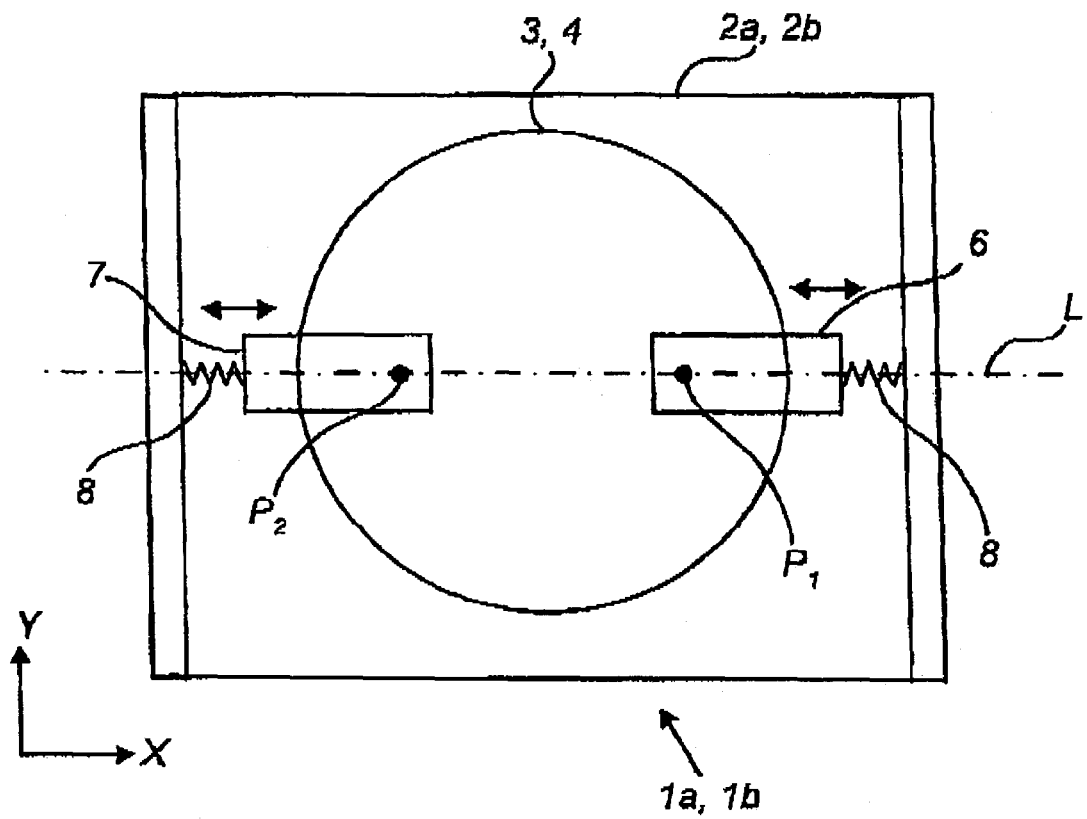
FIG. 11 is a schematic top view of yet another embodiment of the invention.

FIG. 11 is a schematic top view of yet another embodiment of the invention. In this embodiment, the two contact portions P1, P2 are spaced from the edge of the planar object. The contact portions may be arranged to interact with a respective recess or protrusion 18 (FIG. 12) on the surface of the planar object. The protrusion 18 (FIG. 12) may be formed in one piece with the planar object, or it may be a separate part that is attached to the surface of the planar object. As yet another alternative, the recess may be a through-hole in the surface of the planar object. In this embodiment, as in those described above, the connection between the support member 6, 7 and the planar object 3, 4 is also torque-free.

Figure 12:
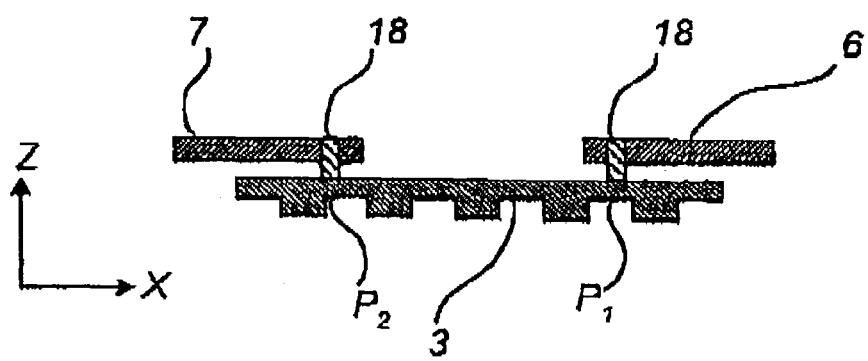
FIG. 12 is a cross-sectional view along the line L of FIG. 11.

FIG. 12 is a cross-sectional view along the line L of FIG. 11. In FIG. 12, the support members are arranged on the back side of the planar object 3, 4, the protrusion 18 being attached to the back surface of the planar object 3, 4. Although FIGS. 11 and 12 illustrate the embodiment implemented on a substrate, it will be appreciated that the embodiment may equally be implemented for a substrate.

Whereas the different embodiments have been described as utilizing a reference axis 11, against which the reference points $P_{0a}$, $P_{0b}$, $P_{0c}$ are aligned, it is realized that each fixture 1a, 1b, 1c may also be provided with means for aligning the stamp 3 or substrate 4 with each other. Such means may comprise actuators for manual or automatic alignment in any desirable direction, such as e.g. along the X-axis, the Y-axis as well as a rotation around the Z-axis.

Whereas the reference axis 11 has been described as a physical axis, along which the fixtures 1a, 1b, 1c are aligned and possibly even displaceable, the axis 11 may also be a virtual axis, against which the reference points $P_{0a}$, $P_{0b}$, $P_{0c}$ are aligned.

While the above description is based on the planar object, i.e. the stamp 3 or substrate 4 having a circular shape, it is realized that the planar object may have an arbitrary shape, such as polygonal, elliptic, square etc. The stamp or substrate may also have one or more recesses or through holes.

As will be appreciated by the person skilled in the art, the different embodiments may be combined without departing from the scope of the claims.

We claim:

1. A device for transferring a pattern from a stamp to a substrate provided with a moldable film by pressing the stamp and the substrate against each other, the device comprising:

at least one fixture, wherein the at least one fixture retains a planar object, the planar object being at least one of the stamp and the substrate, wherein the fixture comprises;

a heating element, wherein the heating element heats the planar object;

a measuring arrangement, wherein the measuring arrangement determines a change in the size of the planar object due to the heating; and wherein the measuring arrangement comprises at least one support member arranged at a predetermined contact portion of the planar object for determining a displacement associated with the change of size of the planar object.

2. A device according to claim 1, further comprising a temperature determining device, wherein the temperature determining device determines the temperature of the planar object based on the change in size of the planar object.

3. A device according to claim 2, wherein the heating element responds to the determination by the measuring arrangement.

4. A device according to claim 1, wherein the measuring arrangement comprises at least one pair of support members arranged at predetermined portions of the planar object, and wherein each support member interacts with the planar object in a respective contact portion (P), and further wherein each pair of support members is arranged for determining a distance between the contact portions (P).

5. A device according to claim 4, comprising at least two pairs of support members.

6. A device according to claim 4, wherein the predetermined portions are arranged at opposite edge portions of the planar object.

7. A device for transferring a pattern from a stamp to a substrate, provided with a moldable film, by pressing the stamp and the substrate against each other, the device comprising:

at least one fixture for retaining a planar object, the planar object being at least one of the stamp and the substrate, the at least one fixture comprising a first and a second support member arranged to contact first and second predetermined portions of the planar object, at first and second contact portions ($P_1$, $P_2$), respectively;

the contact portions ($P_1$, $P_2$) being essentially torque-free in at least a principal plane (X-Y) of the planar object;

the support members being displaceable relative to each other along a first and a second displacement vector; and the first and second displacement vectors, when projected onto the principal plane, forming a line (L), on which projections of the contact portions ($P_1$, $P_2$) are situated.

8. A device according to claim 7, wherein the line (L) is comprised in the principal plane (X-Y), the support members being displaceable relative to each other along the line (L), and the contact portions ($P_1$, $P_2$) being situated on the line (L).

9. A device according to claim 7, wherein a first fixture retains a substrate, and wherein a second fixture retains a stamp.

10. A device according to claim 7, further comprising a reference axis arranged for aligning fixtures relative to each other.

11. A device according to claim 7, further comprising a measuring arrangement, wherein the measuring arrangement determines a distance between the first and second contact portions ($P_1$, $P_2$).

12. A device according to claim 7, wherein at least one of the support members is biased towards the other support member.

13. A device according to claim 9, wherein the first support member is arranged in a stationary position on at least one fixture, the first contact portion ($P_1$) thus providing a reference point ($P_0$); and wherein the second support member is displaceably arranged on another fixture, the second contact portion ($P_2$) thus providing a displaceable point ($P_1$).

14. A device according to claim 13, further comprising a position determining device, wherein the position determining device determines a respective position ($P_{oa}$, $P_{ob}$) of the displaceable support member of the fixtures;

a temperature determining device, wherein the temperature determining device determines a respective temperature of the stamp and the substrate based the respective position; and a heating element, the heating element capable of heating the planar object to a predetermined temperature.

15. A device according to claim 14, wherein the heating element responds to the determination by the measuring arrangement.

16. A device according to claim 9, further comprising a third fixture, adapted to retain a second stamp, the first fixture being adapted to retain a double-sided substrate being provided with a first and a second moldable film.

17. A device according to claim 7, wherein the first and the second predetermined portions are a first and a second edge portion of the planar object.

18. A device according to claim 17, wherein the contact portion ($P_1$, $P_2$) comprises an edge of a support member which interacts with the edge portion of the planar object.

19. A device according to claim 18, wherein the edge of the support member has an extension in a direction that is essentially perpendicular to the principal plane (X-Y) of the planar object, to form an essentially linear contact.

20. A device according to claim 18, wherein the edge of the support member has a point that is directed towards the edge portion of the planar object, to form an essentially point-shaped contact.

21. A device according to claim 18, wherein the edge of the support member interacts with a recess in the edge portion of the planar object.

22. A device according to claim 7, wherein the contact portion ($P_1$, $P_2$) comprises an adapter which is arranged at an edge portion of the planar object and which is pivotably connected to the support member.

23. A device according to claim 7, wherein the first and the second predetermined portions ($P_1$, $P_2$) are spaced from respective edges of the planar object.

24. A device for transferring a pattern from a stamp to a substrate, provided with a moldable film by pressing the stamp against the substrate, the device comprising:

at least one fixture for retaining a planar object, the planar object being at least one of the substrate and the stamp, wherein the at least one fixture comprises a first and a second support member that are arranged to contact with the planar object at a first and a second contact portion ($P_1$, $P_2$), respectively; and wherein the contact portions ($P_1$, $P_2$) are essentially torque-free in at least a principal plane (X-Y) of the planar object;

further wherein the support members are displaceable relative to each other along a line (L), which is comprised in the principal plane (X-Y), and on which the contact portions ($P_1$, $P_2$) are situated; and further wherein said displacement is associated with a change in a size of the planar object due to changes in a temperature of the planar object.

* * * * *

UNITED STATES PATENT AND TRADEMARK OFFICE
CERTIFICATE OF CORRECTION

PATENT NO. : 7,252,492 B2 Page 1 of 1
APPLICATION NO. : 10/464478
DATED : August 7, 2007
INVENTOR(S) : Lennart Olsson and Peter Andersson It is certified that error appears in the above-identified patent and that said Letters Patent is hereby corrected as shown below:

Claim 14, col. 16, line 12, change "based the" to --based on the--.

Signed and Sealed this

Thirteenth Day of November, 2007

JON W. DUDAS
*Director of the United States Patent and Trademark Office*